United States Patent
Keller et al.

(10) Patent No.: US 6,315,592 B1
(45) Date of Patent: Nov. 13, 2001

(54) ZERO INSERTION FORCE SOCKET

(75) Inventors: Rex W. Keller; Gerald R. Nieman, both of Glendale, AZ (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/408,244

(22) Filed: Sep. 29, 1999

(Under 37 CFR 1.47)

(51) Int. Cl.[7] .......................... H01R 13/625; H01R 4/50; H01R 11/22
(52) U.S. Cl. ............................................. 439/342; 439/266
(58) Field of Search ..................... 439/259, 342, 439/261, 266, 330, 525, 526

(56) References Cited

U.S. PATENT DOCUMENTS

| | | | |
|---|---|---|---|
| 1,724,729 | 8/1929 | Ruttenberg et al. | |
| 2,526,869 | 10/1950 | Hubacker | 173/269 |
| 3,609,642 | 9/1971 | Norden | 339/95 D |
| 3,676,832 | 7/1972 | Judge et al. | 339/75 M |
| 3,937,548 | 2/1976 | Dittmann | 339/95 D |
| 4,062,617 | 12/1977 | Johnson | 339/75 M |
| 4,082,399 | 4/1978 | Barkhuff | 339/75 M |
| 4,331,371 | 5/1982 | Ichimura et al. | 339/74 R |
| 4,468,072 | 8/1984 | Sadigh-Behzadi | 339/74 R |
| 4,708,417 | 11/1987 | Woertz | 439/828 |
| 4,950,980 | 8/1990 | Pfaff | 439/296 |
| 5,059,135 | 10/1991 | Matsuoka et al. | 439/268 |
| 5,069,638 | 12/1991 | Schalk | 439/439 |
| 5,102,346 | 4/1992 | Soes | 439/268 |
| 5,116,238 | 5/1992 | Holloman | 439/441 |
| 5,154,626 | 10/1992 | Watson | 439/268 |
| 5,213,530 | 5/1993 | Uratsuji | 439/268 |
| 5,456,613 | * 10/1995 | McHugh | 439/268 |
| 5,489,217 | 2/1996 | Scheitz et al. | 439/342 |
| 5,597,318 | 1/1997 | Townsend | 439/342 |
| 5,622,514 | * 4/1997 | Crompton, III et al. | 439/342 |
| 5,762,511 | * 6/1998 | Scheitz et al. | 439/342 |
| 5,947,778 | * 9/1999 | Lai et al. | 439/876 |
| 6,042,413 | * 3/2000 | Hsiao et al. | 439/342 |

* cited by examiner

*Primary Examiner*—Gary Paumen
*Assistant Examiner*—Edwin A. Leon
(74) *Attorney, Agent, or Firm*—Woodcock Washburn Kurtz Mackiewicz & Norris LLP

(57) ABSTRACT

A socket for connecting an electrical component to a circuit substrate is disclosed. The electrical component has a terminal extending along a terminal axis therefrom. The socket includes a base, a contact secured to the base to electrically connect the terminal to the circuit substrate, a cover attached to the base, and an actuator. The contact includes a beam portion elongated along a beam axis, and a mating portion flexibly connected to the beam portion. The mating portion includes a first contact mating element having a first contact aperture, and a second contact mating element that is flexibly connected to the first contact mating element and has a second contact aperture. The cover has a lead-in aperture for receiving the terminal and allowing the terminal to enter one of the contact apertures. The actuator is operatively coupled to the contact, for causing the contact mating elements to rotate and to engage the terminal.

13 Claims, 7 Drawing Sheets

ZERO INSERTION FORCE SOCKET

CROSS-REFERENCE TO RELATED APPLICATIONS

The subject matter disclosed herein is related to the subject matter disclosed in copending U.S. patent application Ser. No. 09/387,689, filed on Aug. 31, 1999, entitled "Zero Insertion Force Socket."

FIELD OF THE INVENTION

This invention relates to electrical connectors. More particularly, the invention relates to zero insertion force pin grid array sockets for use in connecting an electrical component, such as an integrated circuit to a circuit substrate.

BACKGROUND OF THE INVENTION

A pin grid array (PGA) socket is used for connecting an integrated circuit (IC), such as an application-specific integrated circuit (ASIC), to a circuit substrate, such as a printed circuit board (PCB). PGA sockets typically comprise a base that supports a plurality of contacts, and a cover that includes a plurality of insertion holes. The base is mounted on the circuit substrate to form an electrical connection with circuits on the circuit substrate. The cover is attached to the base prior to assembly of the circuit substrate so that the lateral surfaces of the circuit substrate, base, and cover are stacked in a parallel arrangement.

Typical PGA socket covers have rows and columns of insertion holes. The exact number of insertion holes and the orientation of the insertion holes typically depends on the types of ICs to be connected to the circuit substrate. The rows and columns of insertion holes can be spaced on interstitial centers calculated to accommodate the terminal densities of the ICs. Currently available ICs can have terminals spaced on about 0.05-inch centers or less.

Historically, when it was desired to connect an IC to a circuit substrate, the terminals of the IC were forcibly inserted into the insertion holes of the cover and against the contacts to form an electrical connection between the terminals of the IC and the electrically conductive contacts. It was found that the insertion force required to establish an adequate electrical connection is considerable and can lead to difficulty in installing and removing the IC. Moreover, the terminals of the IC can be damaged easily as a result of its installation and removal.

Therefore, low insertion force (LIF) and zero insertion force (ZIF) PGA sockets have been developed to reduce the insertion forces needed to establish an electrical connection between the contacts and the terminals. The covers of LIF or ZIF PGA sockets are typically attached to the base so that the cover is movable over the lateral surface of the base. An actuator or other mechanism for camming the cover over the surface of the base is included so that the contacts are deflected against the terminals of the IC. The base cover can have contact support walls for supporting the individual contacts.

These LIF and ZIF devices, however, also can cause the terminals of the ICs to be damaged. For example, as the cover moves over the surface of the base, the portion of the terminals extending beneath the cover can be forced against the contacts. This can create a shear force and a moment which cause the terminals to bend or to break. Additionally, the mating force between the contact and the terminal can damage the terminal since the terminals themselves are not provided with any support in the mating region.

Therefore, there is a need for a ZIF PGA socket that can be used to connect an IC to a circuit substrate without causing the portion of the terminals extending beneath the cover to be forced against the contacts, thus reducing the incidence of terminal damage. Moreover, the ZIF PGA socket should be compatible with ICs having terminals spaced on 0.05-inch centers or less.

SUMMARY OF THE INVENTION

According to the present invention, a socket for connecting to a circuit substrate an electrical component having a terminal extending along a terminal axis therefrom comprises a base, a contact secured to the base to electrically connect the terminal to the circuit substrate, a cover attached to the base, and an actuator operatively coupled to the contact.

The contact comprises a beam portion elongated along a beam axis, and a mating portion flexibly connected to the beam portion. The mating portion comprises a first contact mating element that is flexibly connected to the beam portion and has a first contact aperture. The mating portion further comprises a second contact mating element that is flexibly connected to the first contact mating element and has a second contact aperture.

The beam portion has a substantially uniform cross-sectional area, and at least one of the contact apertures has a substantially circular cross-section. The mating portion and beam portion can be integrally formed with one another by stamping, for example, from a sheet of electrically conductive material.

The socket of the present invention can also include a deflection member extending from an inner surface of the cover proximate the lead-in aperture, for causing the contact mating elements to rotate relative to the terminal axis. The cover is attached to the base and has a lead-in aperture for receiving the terminal and allowing the terminal to enter the contact apertures. The deflection member can extend from an inner surface of the cover, for causing the contact mating elements to rotate relative to the terminal axis when the cover is moved along the base. Alternatively, the deflection member can have an aperture through which the beam portion extends, for causing the contact mating elements to rotate relative to the terminal axis when the deflection member is moved relative to the contact.

According to the present invention, a method of electrically connecting to a circuit substrate an electrical component having a terminal extending therefrom comprises providing a socket connector having a contact such as described above, and actuating the mating portion from an open position, in which the contact apertures freely accept the terminal, to a closed position, in which an edge of at least one of the contact apertures is in electrical contact with the terminal.

BRIEF DESCRIPTION OF THE DRAWINGS

The present invention will be better understood, and its numerous objects and advantages will become apparent by reference to the following detailed description of the invention, when taken in conjunction with the following drawings.

DETAILED DESCRIPTION OF PREFERRED EMBODIMENT

Figure 1:
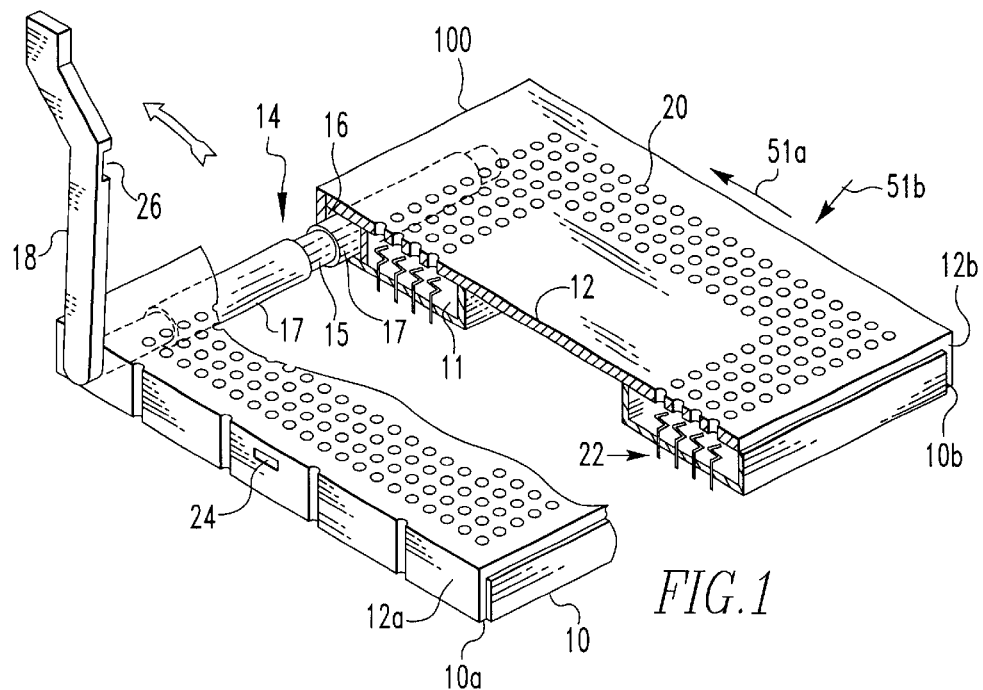
FIG. 1 shows a partial cross section of a pin grid array (PGA) socket according to the invention.

FIG. 1 shows a partial cross section of a pin grid array (PGA) socket 100 according to the present invention. A base 10 and a cover 12 are shown attached together. Preferably, base 10 and cover 12 are made of plastic or other similar material so that walls 10a, 10b of base 10 and walls 12a, 12a of cover 12 are sufficiently flexible to permit walls 12a, 12a to be snapped over ridges (not shown) of corresponding walls 10a, 10b, respectively, to secure cover 12 to base 10.

Base 10 and cover 12 cooperate to form an opening 16 through PGA socket 100 in a plane perpendicular to walls 10a, 10b, 12a, 12a. An actuator 14, such as a cam, is disposed through opening 16 and connected to an actuator bar 18. Actuator bar 18 can be a cast part, formed from wire, or made from other suitable materials. Actuator bar 18 can be rotated to cam cover 12 over a lateral surface 11 of base 10 and along walls 10a, 10b. A notch 26 and a latch 24 are formed on actuator bar 18 and wall 12a of cover 12, respectively, for use in latching actuator bar 18 in place.

Preferably, actuator 14 comprises one or more bearing surfaces 15 and one or more camming surfaces 17. Bearing surfaces 15 are substantially symmetrical about a central axis, while camming surfaces 17 are eccentric. Thus, when actuator bar 18 is lifted as shown in FIG. 1, camming surfaces 17 rotate in a counter clockwise direction and engage portions of cover 12 that partially define opening 16. As a result, cover 12 can be moved relative to lateral surface 11 of base 10. By forming camming surfaces 17 with the appropriate eccentricity, cover 12 can be made to slide along base 10 in the direction shown by arrow 51a or to move slightly away from the base 10 in the direction shown by arrow 51b, or some combination of the two. It should be understood that actuator 14 can be configured in numerous ways to effect the necessary camming, and that actuator 14 shown in FIG. 1 is merely illustrative of an exemplary actuator 14 for camming cover 12 over base 10.

Figure 2:
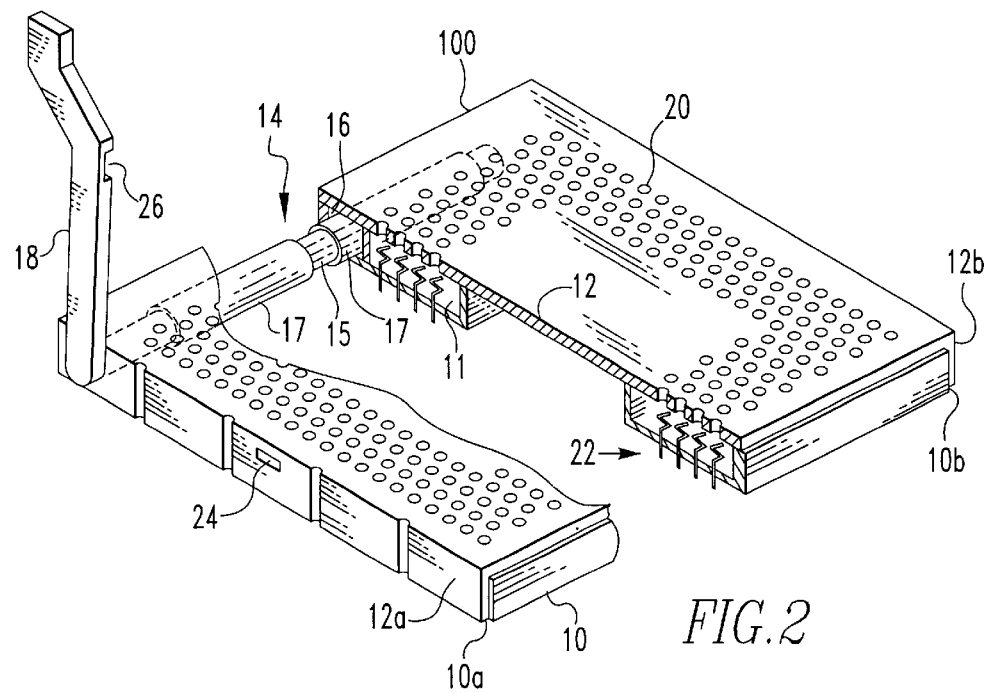
FIG. 2 shows an alternative embodiment of a PGA socket in which the rows and columns of insertion holes are interstitially arranged.

A plurality of electrically conductive socket contacts 22 are supported in base 10 as shown in FIG. 1. The top surface of cover 12 provides a plurality of tapered, lead-in apertures or insertion holes 20. Insertion holes 20 are generally arranged in rows and columns as shown in FIG. 1. In an alternative embodiment, as shown in FIG. 2, insertion holes 20 can be interstitially arranged (e.g., the rows and columns of insertion holes 20 can be staggered). In general, insertion holes 20 can be arranged in any arrangement corresponding to the arrangement of terminals on the electronic component to be received into PGA socket 100. Insertion holes 20 should be dimensionally large enough to receive the terminals of the electronic component without measurable insertion force. Preferably, the plurality of contacts 22 are arranged such that each insertion hole 20 corresponds to one contact 22; although, in some instances, there may be fewer contacts 22 than insertion holes 20. As shown in FIGS. 1 and 2, a central area 12c of cover 12 can be devoid of insertion holes 20. This configuration of insertion holes is purely exemplary and, in alternate embodiments of a PGA socket according to the present invention, insertion holes 20 can be distributed throughout cover 12 in any arrangement.

Figure 3A:
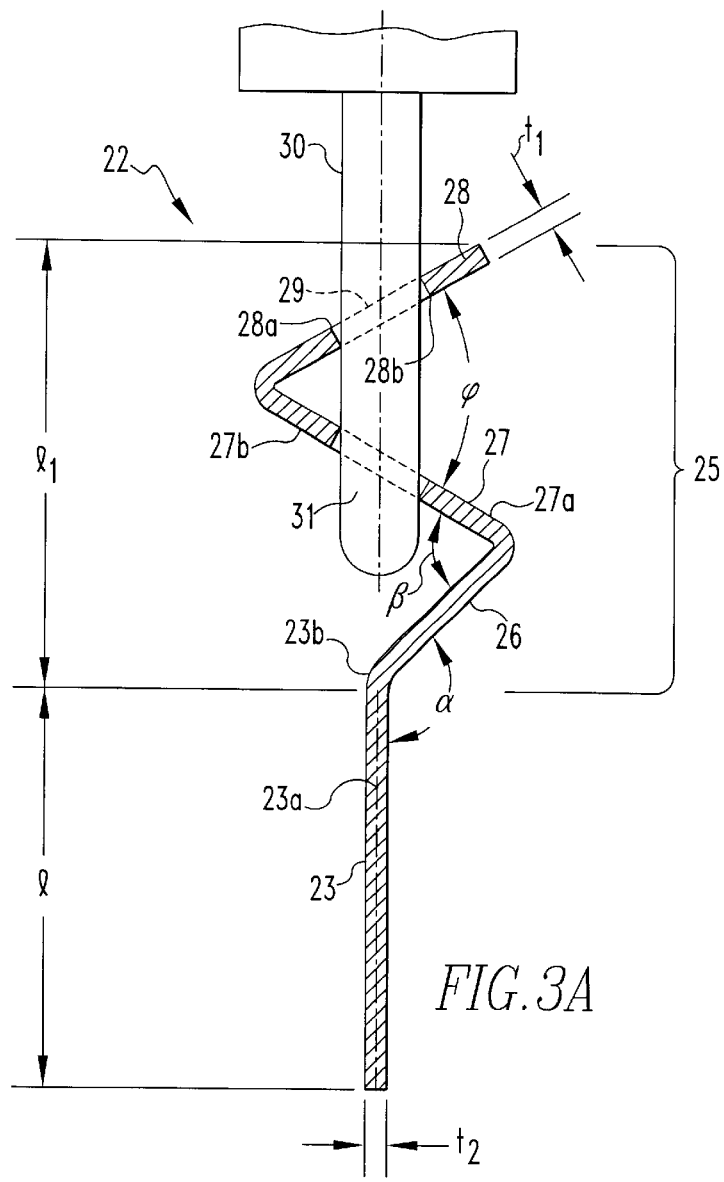
FIG. 3A provides a detailed cross-sectional view of a contact according to the invention in an open PGA socket.
Figure 3B:
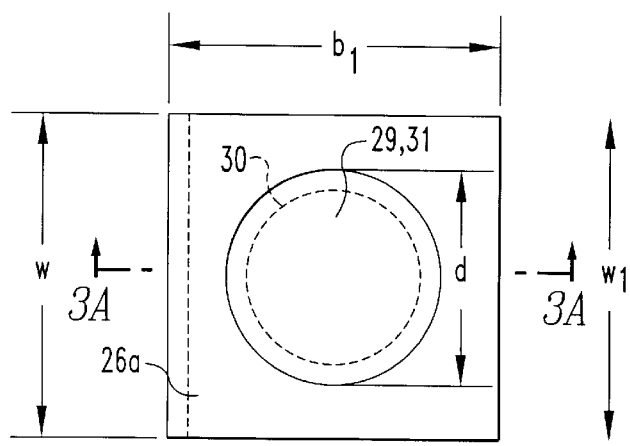
FIG. 3B provides a detailed top view of a contact according to the invention in an open PGA socket.

FIG. 3A provides a detailed cross-sectional view, and FIG. 3B provides a detailed top view, of contact 22 according to the present invention. As shown in FIG. 3A, contact 22 comprises a beam portion 23 elongated along, and preferably symmetric about, a beam axis 23a. Contact 22 also comprises a mating portion 25 that is flexibly connected to an end 23b of beam portion 23. Preferably, mating portion 25 comprises a first contact element 27 that is flexibly connected to a second contact element 28 at an angle $\phi$, which is preferably about 60°. Mating portion 25 can also have a coupling element 26 that is flexibly connected to beam element 23 at an angle a, which is preferably about 130°, and to first contact element 27 at an angle $\beta$, which is preferably about 60°.

Contact element 27 has an aperture 31 extending from a first face 27a to a second face 27b opposite first face 26a. Similarly, contact element 28 has an aperture 29 extending from a first face 28a to a second face 28b opposite first face 28a. The size and shape of apertures 29 and 31 are selected to be slightly larger than the cross-sectional area of a terminal 30 that is to be received into apertures 29 and 31. Preferably, as shown in FIG. 3B, each of apertures 29 and 31 has a circular cross-section having a diameter, d, to receive a terminal 30 having a round cross-section, for example.

Preferably, beam portion 23 and mating portion 25 are integrally stamped and formed from a single sheet of conductive material. Thus, in a preferred embodiment, a thickness $t_1$ of mating portion 25 is the same as a thickness $t_2$ of beam portion 23. Thicknesses $t_1$, $t_2$ could be less than about 0.005 inches; more preferably about 0.004 to about 0.005 inches. Alternatively, beam portion 23 and mating portion 25 could have different thicknesses $t_1$, $t_2$.

Beam portion 23 has a length l and mating portion 25 has a length $l_1$ that, preferably, is about equal to length l. Preferably lengths l and $l_1$ are each less than about 0.100 inches, and more preferably of about 0.020 to about 0.100 inches. Preferably, mating portion 25 has an overall width $w_1$ and a breadth $b_1$, each of which is less than about 0.030 inches. Preferably, beam portion 23 has a uniform, more preferably rectangular, cross-sectional area along its length l and has a width w equal to width $w_1$ of mating portion 25, preferably of less than about 0.030 inches. It is expected that many electronic components, such as integrated circuits, will provide terminals that are spaced on less than 0.100-inch centers, and most likely on about 0.04- to about 0.05-inch centers. Thus, in a preferred embodiment, the contacts are stamped on about 0.04- to about 0.05-inch centers from a plate of an electrically conductive material, such as beryllium copper, having a thickness of about 0.004 to about 0.005 inches.

Figure 4:
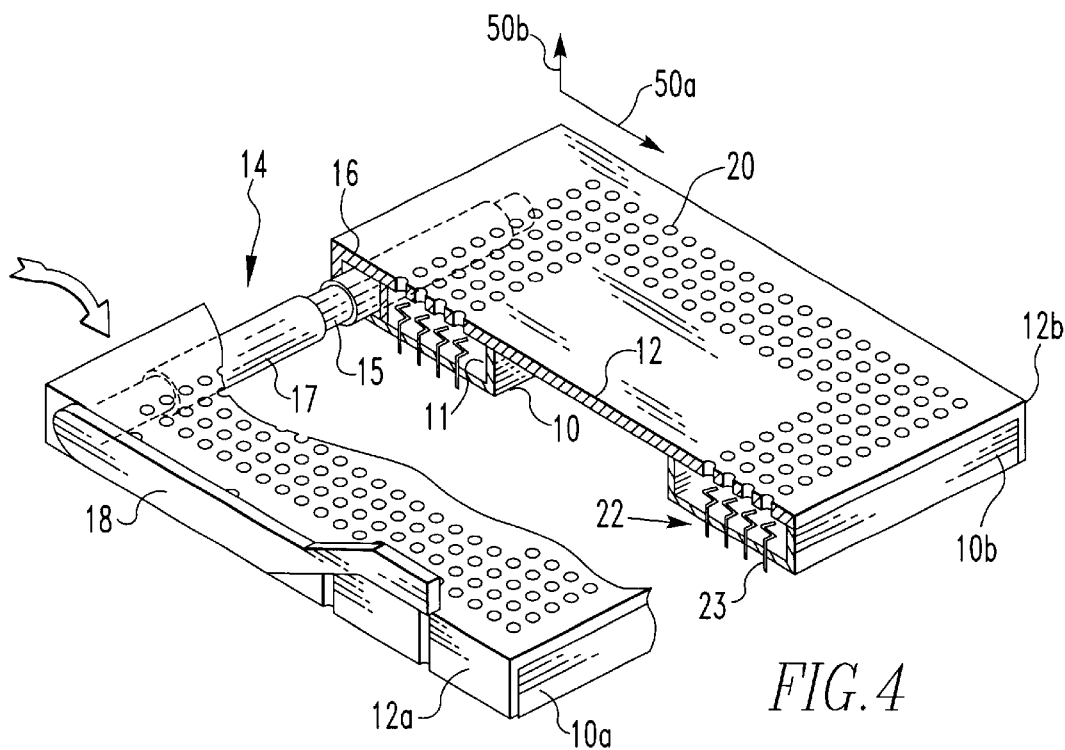
FIG. 4 shows a partial cross-section of a PGA socket according to the invention in a closed position.
Figure 5A:
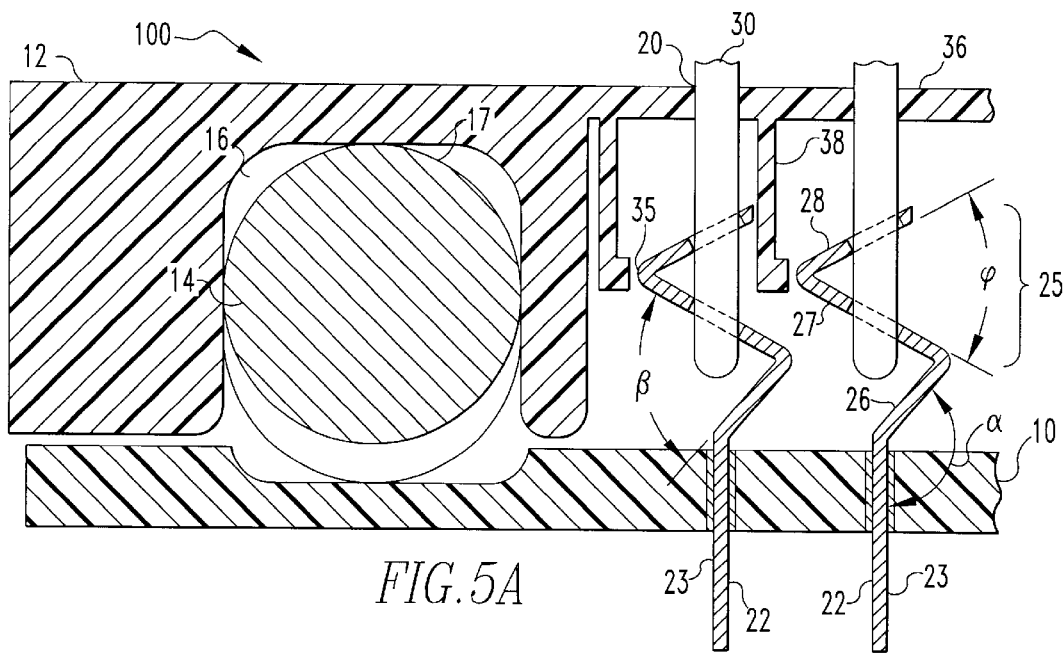
FIGS. 5A and 5B show enlarged cross-sectional views of a preferred embodiment of a PGA socket according to the invention in open and closed positions, respectively.
Figure 5B:
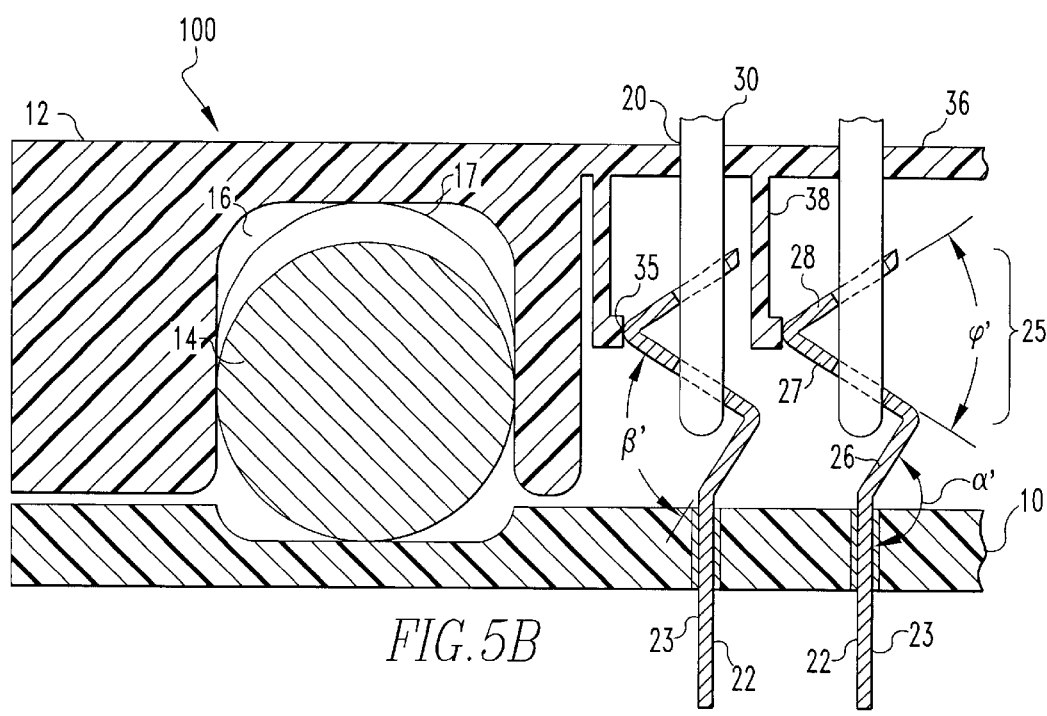

FIG. 4 shows a partial cross section of PGA socket 100 in a closed position. FIGS. 5A and 5B show an enlarged cross section of PGA socket 100 in an open and closed position, respectively. As shown in FIGS. 5A and 5B, beam portions 23 of contacts 22 extend through base 10 to connect electrically with, for example, plated apertures in a circuit substrate (not shown). In a preferred embodiment, contacts 22 are interference fit within base 10 and freely supported thereby. With PGA socket 100 in an open position, terminals 30 of an IC can be inserted through insertion holes 20 in cover 12 and apertures 29 and 31 in contacts 22 without being forcibly pressed against, or even engaging, contacts 22.

In the embodiment shown in FIG. 5A, camming surfaces 17 of actuator 14 are formed so that as actuator bar 18 moves to an open position, cover 12 is made to slide along base 10 (in the direction shown by arrow 51a in FIG. 1). For each contact 22, cover 12 includes a deflection member 38 that extends proximate to contacting mating portion 25, at a vertex 35 where first element 27 and second element 28 are flexibly connected. Deflection member 38 resiliently bends mating portion 25 when cover 12 is moved along base 10 from an open position to a closed position. The bending of mating portion 25 at vertex 35 causes contact members 27 and 28 to rotate, thus reducing the effective diameter of apertures 29 and 31 and causing contact 22 to engage terminal 30 in electrical contact.

As shown in FIG. 5B, when actuator bar 18 is moved from its open position to its closed position (as shown in FIG. 4), camming surfaces 17 rotate (in a clockwise direction in the embodiment shown in FIG. 5A) to provide a force against the walls forming opening 16. This causes cover 12 to slide along base 10 in the direction of arrow 50a generally parallel to the base 10 and in a direction depicted by arrow 29b generally perpendicular to the base 10 (as shown in FIG. 4).

As cover 12 moves toward base 10 (with terminals 30 having been previously inserted into insertion holes 20), deflection members 38 push on corresponding mating portions 25, resiliently bending mating portions 25 relative to beam portions 23. Upon full rotation of actuator bar 18, beam portion 23 forms an angle α with coupling element 26 of mating portion 25, where angle α is greater than angle α. Similarly, coupling element 26 forms an angle β' with first contact element 27, where angle β' is greater than angle β, and contact element 27 forms an angle φ' with second contact element 28, where angle φ' is greater than angle φ. The arrangement of mating portion 25 when PGA socket 100 is in a closed position creates an effective diameter d' of apertures 29 and 31 that is smaller than true diameter d when PGA socket 100 is in an open position (see FIG. 8). Effective diameter d' of apertures 29 and 31 is measured perpendicular to terminal axis 30a of terminal 30 inserted into apertures 29 and 31. As contact elements 27 and 28 rotate relative to terminal axis 30a, effective diameter d' decreases so that terminal 30 eventually makes contact with mating portion 25. Thus, when socket 100 is in a closed position, contact 22 should complete an electrical connection between terminal 30 and the circuit substrate.

Figure 6A:
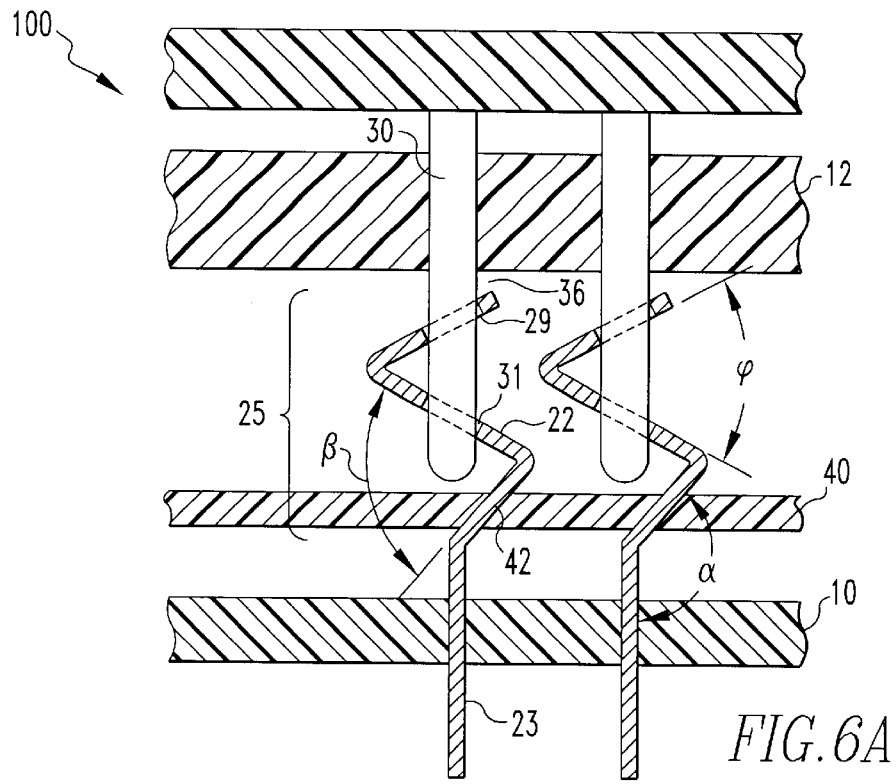
FIGS. 6A and 6B show enlarged cross-sectional views of another preferred embodiment of a PGA socket according to the invention in open and closed positions, respectively.
Figure 6B:
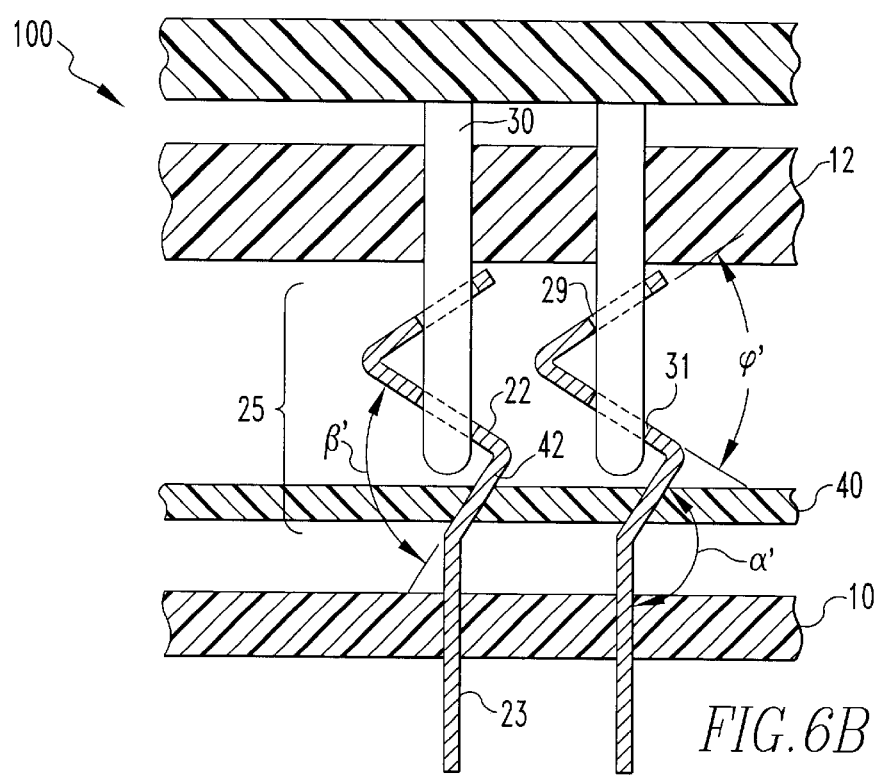

FIG. 6A shows an enlarged cross-sectional view of another preferred embodiment of PGA socket 100 in an open position. A deflection member 40 extends between generally stationary cover 12 and base 10. Deflection member 40 is generally parallel to base 10, and perpendicular to beam portion 23 of contact 22. Deflection member 40 includes a plurality of apertures 42. A contact 22 extends through each aperture 42 and into base 10. Deflection member 40 is disposed between mating portion 25 and base 10 and can be moved independently of cover 12 and base 10. Thus, as shown in FIG. 6B, deflection member 40 can be moved generally parallel to cover 12 and base 10 and along a direction perpendicular to beam portion 23 of contact 22.

As deflection member 40 moves relative to cover 12 and base 10 (with terminals 30 having been previously inserted into insertion holes 20), deflection member 40 pushes on mating portion 25 of contact 22. This force causes coupling element 26 to cant toward terminal 30 until the side wall of apertures 29 and 31 engage terminal 30. Further movement of deflection member 40 causes the edges of apertures 29 and 31 to engage terminal 30. The force is applied to mating portion 25 as PGA socket 100 is being closed, at which point mating portion 25 is in electrical contact with terminal 30 as shown. Once again, effective diameter, d', of apertures 29 and 31 (i.e., the diameter of apertures 29 and 31 measured perpendicular to terminal axis 30a), is smaller than its true diameter, d (see FIG. 8). Effective diameter, d', decreases so that terminal 30 eventually makes electrical contact with mating portion 25. Thus, contact 22 completes an electrical connection between terminal 30 and the circuit substrate.

Figure 7A:
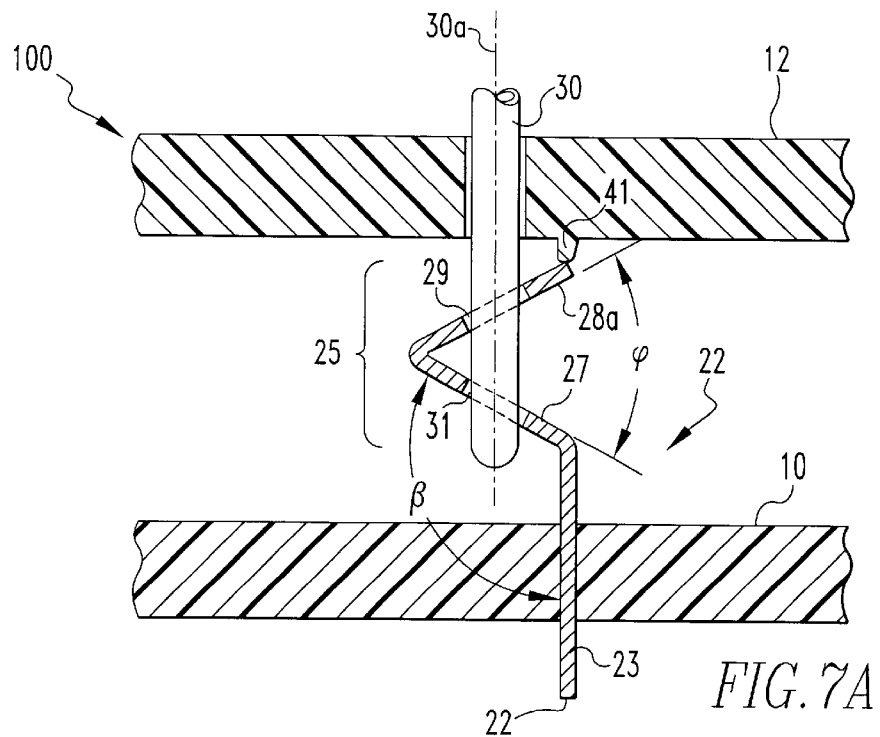
FIGS. 7A and 7B show enlarged cross-sectional views of another preferred embodiment of a PGA socket according to the invention in open and closed positions, respectively.
Figure 7B:
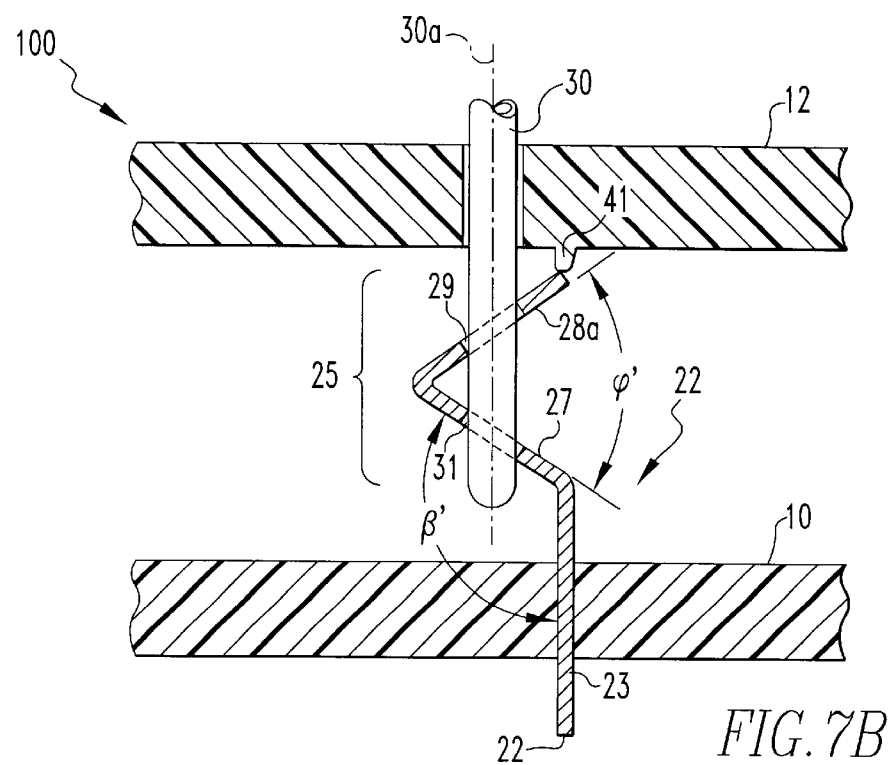

FIGS. 7A and 7B show an enlarged cross-sectional view of another preferred embodiment of PGA socket 100 in an open and closed position, respectively. For each contact 22, cover 12 includes a deflection member 41 that extends toward second contact element 28, from an inside face of cover 12. Deflection member 41 exerts a force on the distal end 28a of contact element 28. This force slightly compresses contact mating portion 25 so that the effective diameters of contact apertures 29 and 31 are sufficiently large that terminal 30 can be inserted through contact apertures 29 and 31 without measurable insertion force. Upon full upward rotation of actuator bar 18 (as shown in FIGS. 1 and 2), beam portion 23 forms an angle β with first contact element 27 of mating portion 25, and first contact element 27 forms an angle φ with second contact element 28.

In the embodiment shown in FIG. 7A, camming surfaces 17 of actuator 14 are formed so that as actuator bar 18 moves to an open position, cover 12 is made to slide slightly toward base 10 (in the direction shown by arrow 51b in FIG. 1). As shown in FIG. 7B, when actuator bar 18 is rotated downward (as shown in FIG. 4), cover 12 moves away from base 10 (in the direction shown by arrow 50b in FIG. 4). As cover 12 moves relative to base 10 (with terminal 30 having been previously inserted into insertion hole 20), the force exerted by deflection member 41 on distal end 28a of contact element 28 is reduced.

Consequently, contact mating portion 25 expands slightly, until the edges of apertures 29 and 31 engage terminal 30. Upon full rotation of actuator bar 18 to a closed position, beam portion 23 forms an angle β' with first contact element 27, where angle β' is greater than angle β. Similarly, first contact element 27 forms an angle φ' with second contact element 28, where angle φ' is greater than angle φ.

Figure 8:
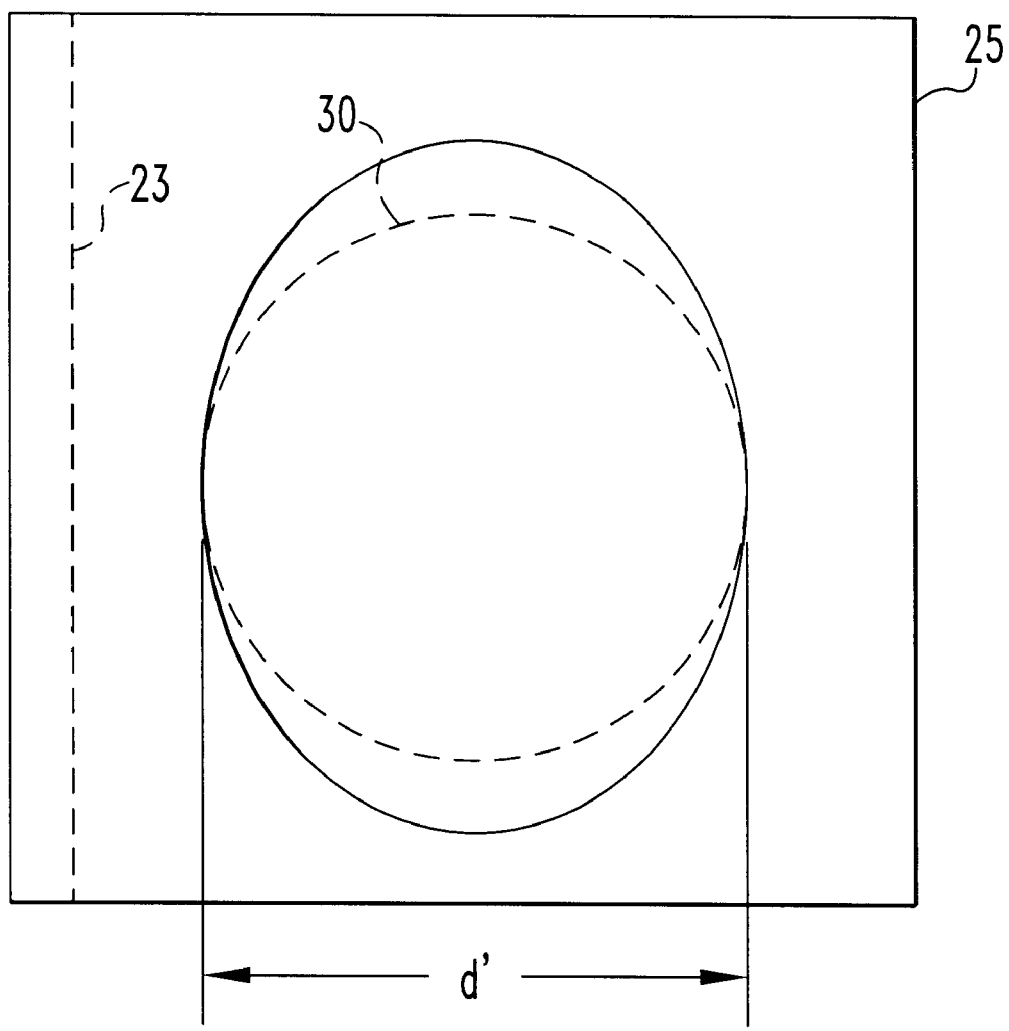
FIG. 8 provides a detailed top view of a according to the invention in a closed PGA socket.

Thus, the arrangement of mating portion 25 when PGA socket 100 is in a closed position creates an effective diameter d' of apertures 29 and 31 that is smaller than true diameter d when PGA socket 100 is in an open position (see FIG. 8). Effective diameter d' of apertures 29 and 31 is measured perpendicular to terminal axis 30a of terminal 30 inserted into apertures 29 and 31. As contact elements 27 and 28 rotate relative to terminal axis 30a, effective diameter d' decreases so that terminal 30 eventually makes contact with mating portion 25. Thus, when socket 100 is in a closed position, contact 22 should complete an electrical connection between terminal 30 and the circuit substrate.

Those skilled in the art will appreciate that numerous changes and modifications may be made to the preferred embodiments of the invention and that such changes and modifications may be made without departing from the spirit of the invention. For example, it should be understood that a contact according to the present invention can include more than two contact mating elements. It should also be understood that the deflection member can be made to press on contact in any manner, and that the cover can be made to move relative to the base in any direction or combination of directions. It is therefore intended that the appended claims cover all such equivalent variations as fall within the true spirit and scope of the invention.

We claim:

1. A socket for connecting to a circuit substrate an electrical component having a terminal extending along a terminal axis therefrom, the socket comprising:

a base;

a contact secured to the base to electrically connect the terminal to the circuit substrate, the contact comprising:
a beam portion having a length along a beam axis, and
a mating portion flexibly connected to the beam portion, comprising a first contact mating element having a first contact aperture, and a second contact mating element that is flexibly connected to the first contact mating element and has a second contact aperture, a cover, attached to the base, that has a lead-in aperture for receiving the terminal and allowing the terminal to enter the contact apertures; and an actuator operatively coupled to the contact, for causing the contact mating elements to rotate and to engage the terminal.

2. The socket of claim 1, wherein at least one of the apertures has a substantially circular cross-section.

3. The socket of claim 1, wherein the beam portion has a substantially uniform cross-sectional area along a length thereof.

4. The socket of claim 1, further comprising:

a deflection member extending from an inner surface of the cover proximate the lead-in aperture, for causing the contact mating elements to rotate.

5. The socket of claim 4, wherein the deflection member extends from the inner surface of the cover, for causing the contact mating elements to rotate relative to the terminal axis when the cover is moved along the base.

6. The socket of claim 4, wherein the deflection member has an aperture through which the mating portion extends, for causing the contact mating elements to rotate relative to the terminal axis when the deflection member is moved relative to the contact.

7. A contact comprising:

a beam portion having a length along a beam axis, and a mating portion flexibly connected to the beam portion, comprising a first contact mating element having a first contact aperture, and a second contact mating element that is flexibly connected to the first contact mating element and has a second contact aperture, wherein the apertures are aligned along the beam axis.

8. The contact of claim 7, wherein at least one of the plurality of apertures has a substantially circular cross-section.

9. The contact of claim 7, wherein the beam portion has a substantially rectangular cross-sectional area along the length thereof.

10. The contact of claim 7, wherein the mating portion and beam portion are integrally formed with one another.

11. The contact of claim 7, wherein the contact is made of an electrically conductive material.

12. The contact of claim 7, wherein the contact is formed by stamping from a sheet of electrically conductive material.

13. A socket, comprising:

a base;

a plurality of contacts mounted to the base, each contact having:
a mounting portion for engaging a substrate; and
a mating portion for engaging a terminal of an electronic component, the mating portion having a first arm with an opening therethrough and a second arm with an opening therethrough; and a cover secured to the base and movable between an open and a closed position, wherein, in the open position, the openings are arranged to allow the terminal to extend therethrough, and, in the closed position, the openings are arranged so that the contact engages the terminal.

* * * * *